Oct. 20, 1970 D. G. DEAK 3,535,599

FIELD EFFECT SEMICONDUCTOR DEVICE WITH MULTIPLE CHANNEL REGIONS SELECTIVELY SWITCHED FROM CONDUCTING TO NONCONDUCTING

Original Filed Nov. 2, 1966 3 Sheets-Sheet 1

INVENTOR.
DAVID G. DEAK
BY
CAROTHERS & CAROTHERS
HIS ATTORNEYS

INVENTOR.
DAVID G. DEAK
BY
CAROTHERS & CAROTHERS
HIS ATTORNEYS

FIELD EFFECT SEMICONDUCTOR DEVICE WITH MULTIPLE CHANNEL REGIONS SELECTIVELY SWITCHED FROM CONDUCTING TO NONCONDUCTING

Original Filed Nov. 2, 1966

INVENTOR.
DAVID G. DEAK
BY
CAROTHERS & CAROTHERS
HIS ATTORNEYS

United States Patent Office
3,535,599
Patented Oct. 20, 1970

3,535,599

FIELD EFFECT SEMICONDUCTOR DEVICE WITH MULTIPLE CHANNEL REGIONS SELECTIVELY SWITCHED FROM CONDUCTING TO NONCONDUCTING

David G. Deak, Pittsburgh, Pa., assignor of one-half to Carothers and Carothers, a partnership composed of W. Douglas Carothers, Jr., and Floyd B. Carothers, Pittsburgh, Pa.

Continuation of application Ser. No. 591,559, Nov. 2, 1966. This application June 11, 1969, Ser. No. 834,221
Int. Cl. H01l *11/10*
U.S. Cl. 317—235 4 Claims

ABSTRACT OF THE DISCLOSURE

This invention relates generally to a semiconductor with a gate control field effect on a conductive channel with source and drain connections and the method of controlling the same and more particularly to a static intrinsic blocking region adjacent the conductive channel to cooperate with a field effect producing a dynamic intrinsic blocking region to control and switch current flowing through the conductive channel between the source and drain connections of the semiconductor.

This is a continuation of application Ser. No. 591,559 filed Nov. 2, 1966, now abandoned.

Aside from the drain voltage, a field effect transistor must rely solely upon the field effect to control the current flow. When the channel has two opposed gate connections to induce the field charge operating as a space charge in the region of the conductive channel it is impossible to obtain a complete shut off of current flow. Again, it is sometimes undesirable to build up the fields from the opposed gates as it creates other problems in the operation of the semiconductor, particularly when it is a complicated semiconductor.

Another difficulty resides in the fact that single or opposed gate field charges cannot control or shut off a current flow in a conductive region without measurable leakage which prevents the use of the semiconductor in many circuit combinations.

The principal object of this invention is the provision of a static intrinsic blocking region in a semiconductor adjacent a conductive region. This static intrinsic blocking region with the conductive channel which will cooperate with a single gate field effect producing a dynamic intrinsic blocking region in the conductive channel to control and shut off the current flow in an adjacent conductive channel without current leakage or without apparent current leakage.

Another important object of this invention is the provision of a semiconductor having a bank including a plurality of region portions each including a static intrinsic blocking region, a conductive channel and a drain connection, which may remain independent or all the connections may be joined together. There may be two or more pairs of opposed gates having junctions with the semiconductor regions to control and to switch current flow in each conductive channel portion. This network of conductive channel region portions isolated by static intrinsic blocking regions may function as a solid state video viewer or visual XY recorder, with materially lower voltages than presently required for cathode ray tubes. It may also be combined with additional geometrical matrices to function as associated computor circuits with a single or multiple source connection or independently controlled source connections.

This invention contemplates the use of the static intrinsic blocking region in combination with a conductive channel region that may be unipolar or bipolar. The switching effect by the dynamic gate field or durability of the dynamic gate fields is just as effective between connected conductive channel sources as between portions of a conductive channel source and drain connections.

The field effect semiconductor of this invention builds upon itself through the use of the static intrinsic blocking region with and without the dynamic intrinsic blocking region coated by the field effects across the conductive channels or channel portion whether these fields are from the semiconductor gate or from an induced external effect from a source independent of the transistor controlled. The requirement is that the field, regardless of its source, is effective through the regions of the conductive channel portions and the static intrinsic blocking regions to arrest the charge carriers converting that portion effected by the dynamic control field and convert the region to a dynamic intrinsic blocking region and thereby control the flow as well as shut off the current flow through selected of said conductive channel portions. This may also control the re-direction of current flow to an accumulative number of conductive channel portions as in computer operations.

This is a brief summary of the provision of a field effect semiconductor switching device having at least one conductive channel region with spaced source and drain connections and at least one gate with a control connection which is characterized by the addition of a static intrinsic blocking region in the semiconductor adjacent the conducting channel region to cooperate with the field induced through the gate to arrest the charge carriers and control or stop the current flow through the semiconductor.

Other objects and advantages appear hereinafter in the following description and claims.

The accompanying drawings show for the purpose of exemplification without limiting the invention or claims thereto, certain practical embodiments illustrating the principles of this invention wherein:

Figure 3:
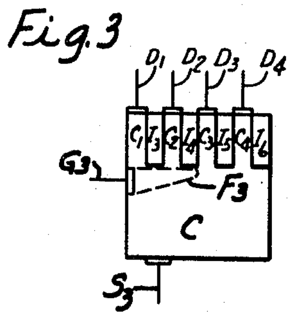

FIG. 3 is a diagrammatic view of a unipolar semiconductor comprising this invention with a plurality of independent drains and conductive channel region portions spaced or encircled by static intrinsic blocking regions and with only one gate means having a field effect to progressively cooperate with the static intrinsic blocking regions to progressively control or shut off current flow through the conductive channel region portions.

Figure 4:
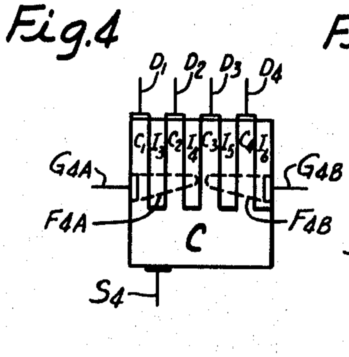

FIG. 4 is a diagrammatic view of a unipolar semiconductor comprising this invention with a bank including a plurality of independent drains on their respective conductive channel region portions spaced or encircled by their respective static intrinsic blocking regions and with at least two cooperative gate means to induce a dynamic field effect through said conductive channel portions to control or shut off the current flow through selection of the conductive channel portions by cooperating with the static intrinsic blocking region.

Figure 5:
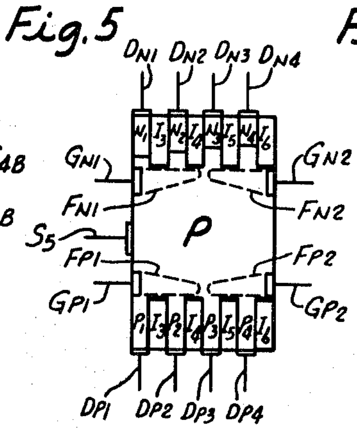

FIG. 5 is a diagrammatic view of a bipolar semiconductor comprising this invention having a plurality of independent banks of a plurality of independent drains on their respective conductive channel region portions and spaced or encircled by their respective static intrinsic blocking regions and each bank with at least two cooperative gate means to control their separate current flow or shut off from at least one common source connection.

Figure 6:
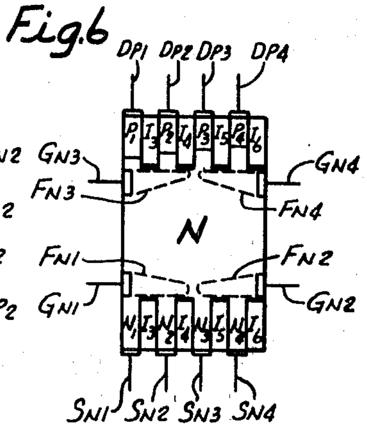

FIG. 6 is a diagrammatic view of a bipolar semiconductor comprising this invention having a bank of a plurality of independent drains on their respective conductive channel region portions and spaced or encircled by their respective static intrinsic blocking regions and with at least two independent and cooperative gate means to control their separate current flow or shut off from a bank of a plurality of independent source connections on their respective conductive channel source regions spaced or encircled by their respective static intrinsic blocking regions and with at least two independent and cooperative gate means to control the source of the current flow or shut off from their respective conductive channel source connections.

Figure 7:
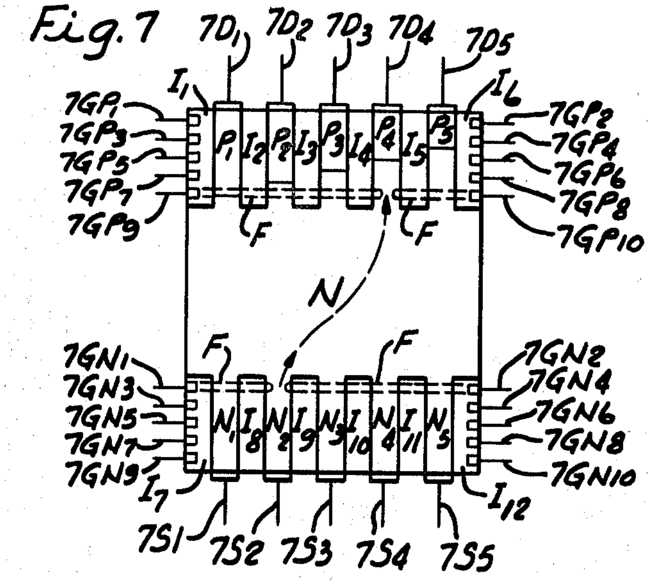

FIG. 7 is a diagrammatic view of a polar section semiconductor block having a bank of drain connected conductive channel region portions and a bank of independent source connected conductive channel region portions, each of said channel portion defined by a static intrinsic blocking region and having a series of gate means on each face of the block to induce field effect across said regions to control the charge carriers to control or shut off the current flow in selected conductive channel portions.

Figures 8, 9, 10:
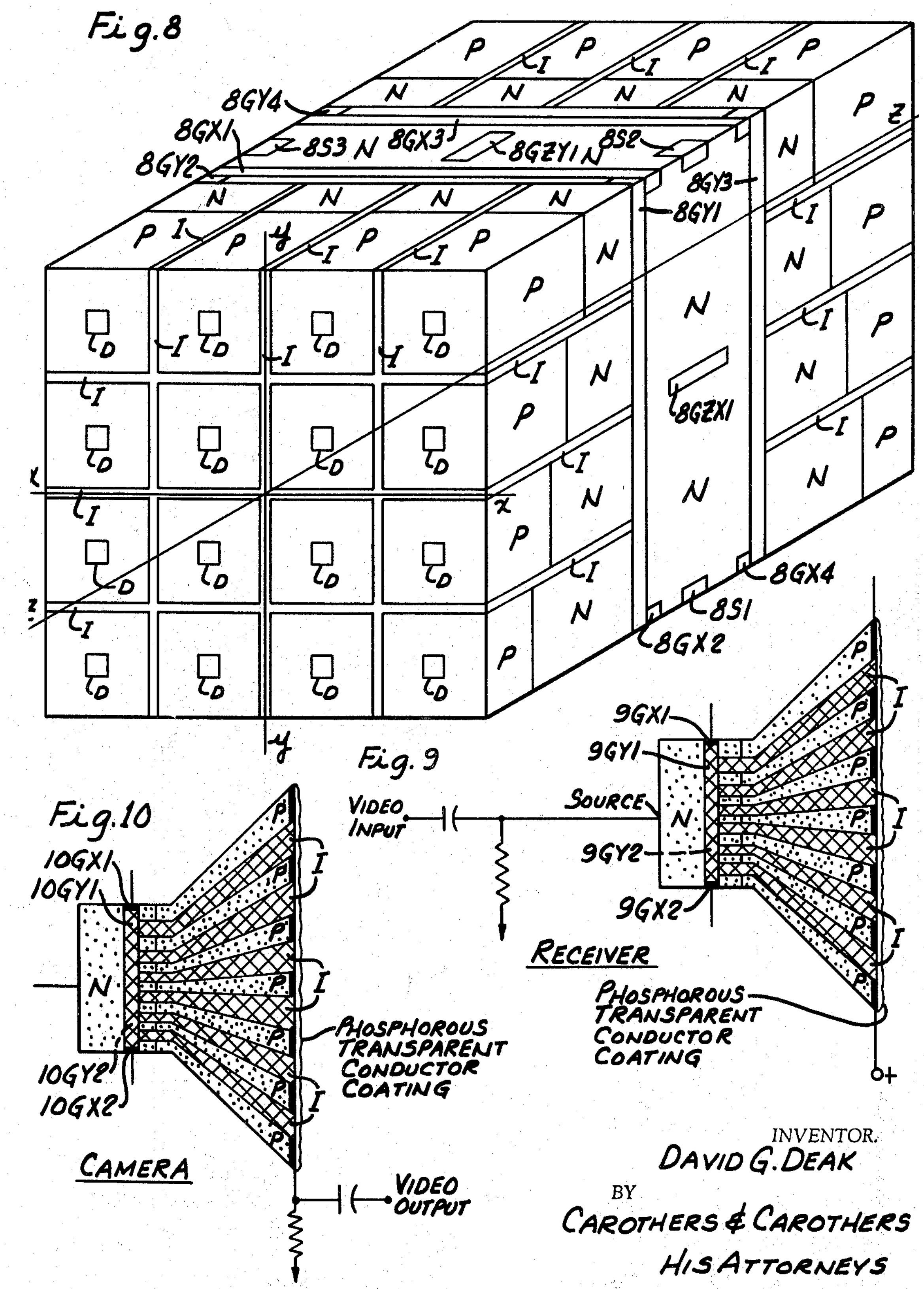

FIG. 8 is a diagrammatic view of a multipolar hexahedron semiconductor each polar section forming a block having a bank of drain connected conductive channel region portions and a bank of independent source connected conductive channel region portions, each of said channel portions being defined by a static intrinsic blocking region and controlled by a series of gate means on each face of each block of each polar section, and each polar section joined with corresponding polar sections to form a connected network of a single geometric semiconductor switching device.

FIG. 9 is a diagrammatic view of a video receiver device employing the principles of the present invention.

FIG. 10 is a diagrammatic view of a video camera device employing the principles of the present invention.

Figure 11:
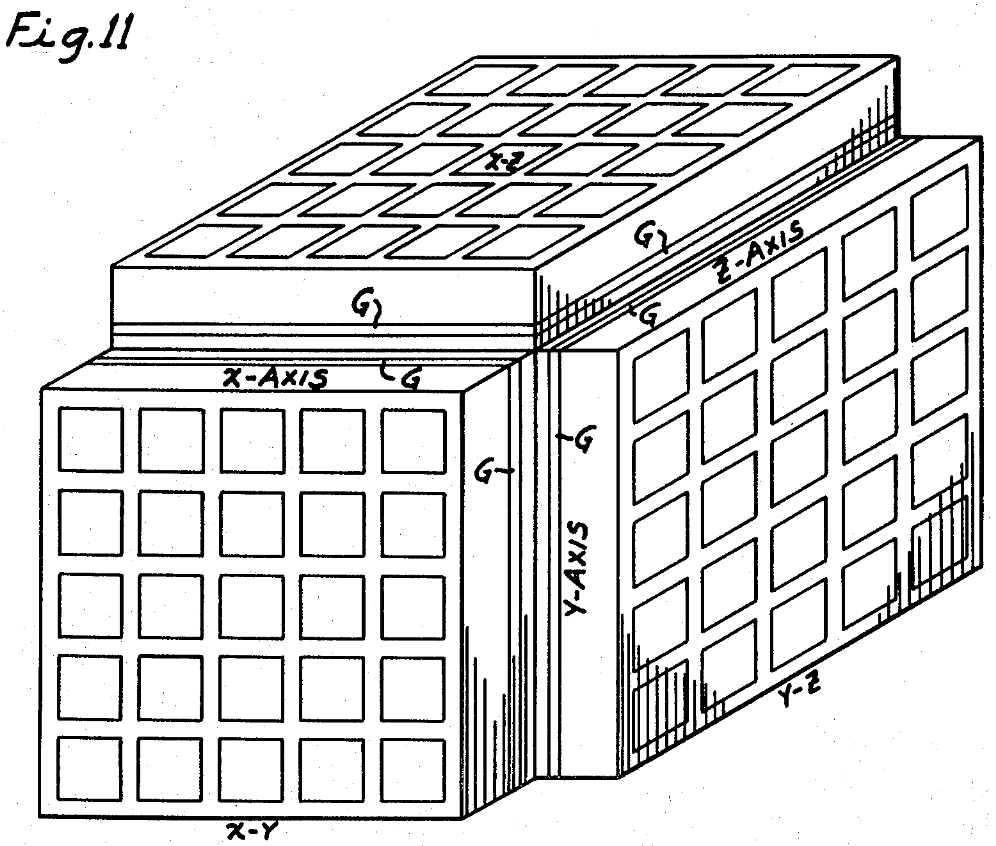

FIG. 11 is a diagrammatic view illustrating an embodiment of the present invention wherein a video reproduction of an image is produced in three dimensions with the use of three panels having the basic makeup of the device shown in FIG. 10.

Figure 12:
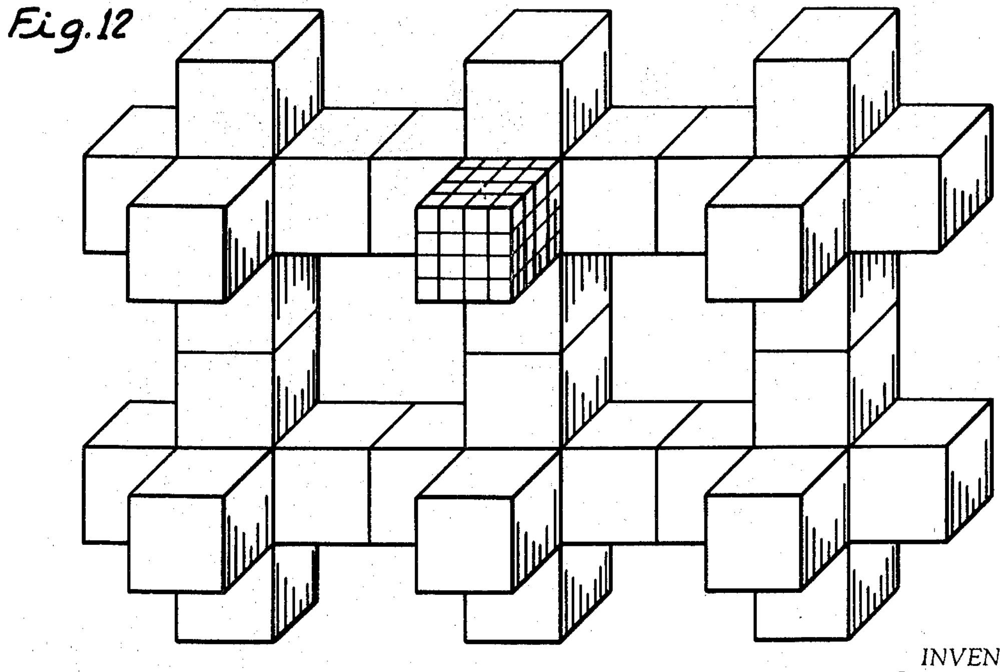

FIG. 12 is a diagrammatic view illustrating a combination of the hexahedron units as illustrated in FIG. 8.

Figure 1:
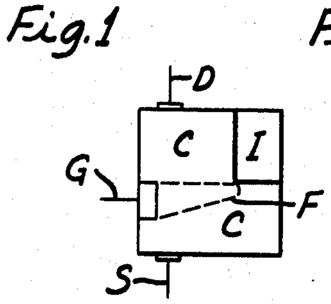
FIG. 1 is a diagrammatic view of the simplest form of this invention employing a unipolar semiconducting channel region with a gate having a junction therewith intermediate the source and drain connections and so the field effect will cooperate with the static intrinsic blocking region.

Referring to the drawings and particularly FIG. 1, the semiconductor C forms a conductive channel between the source S and drain D. A portion of this conductive channel C is bound on one side by a static intrinsic blocking region. This blocking region may extend the full length of the conductive channel C or it may be stopped short as illustrated in FIG. 1 and as indicated by I. A static intrinsic blocking region is ordinarily the same material as the semiconductor C. As a matter of fact, it is an undoped region of the semiconductor material which could be silicon or any other semiconductor material listed in the third and fourth periodical table of the chemical elements.

The conductive region C of the semiconductor, as illustrated may be doped either to be P material or an N material. Thus, in each instance where the semiconductors indicated by C, it is understood to be conductive material of either the P or N type or any other character capable of forming electric carriers for the purpose of producing a semiconductor material from silicon.

A gate G is formed on one side face of the semiconductor C so that its junction, therewith, will be approximately in line with the end of the region I so that the field F from G that is propagated through the regions in the semiconductor, whether they be conductive or nonconductive, will be in effect across the conductive channel until it engages at least the end or corner of the nonconductive region I as indicated at dotted lines and marked F.

This field or field effect when properly energized will arrest the carriers in the conductive material so as to produce a dynamic blocking region that prevents any movement of the carriers through the channel when the field actually engages or extends into the intrinsic blocking region I.

The gate G is, of course, doped with a material that is opposite from that of a material employed in that portion C of the semiconductor. In other words, if the portion C is doped as an N material, the gate G would be a P doped material or vice-versa.

Each of the ohmic connections, as indicated by the source connection S or the drain connection D or the gate connection G are provided so that these different parts of the semiconductor may be connected into a circuit.

As illustrated in FIGS. 1 through 4, the semiconductor is illustrated as a unipolar device whereas in some of the other figures, the semiconductor is illustrated as a bipolar device. It is, of course, understood that each of the structures shown in FIGS. 1 through 4 could likewise be a bipolar device in which case the dope material opposite that occupying the source and of the semiconductor would be within that portion of the channel region between the drain connections and the end of the static intrinsic blocking region and it would be preferred that it would not extend any lower or let us say, beyond the lower end of the static intrinsic blocking region.

Figure 2:
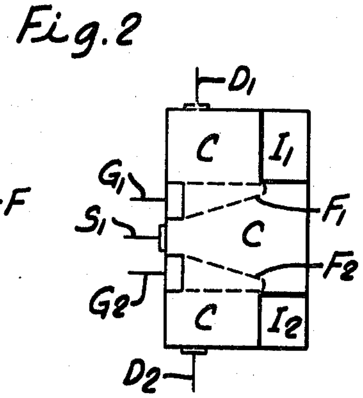
FIG. 2 is a diagrammatic view of a unipolar semiconductor comprising this invention having two independent conductive channel region portions and their respective static intrinsic blocking regions and each having a gate and drain connection with a common source connection.

Referring to FIG. 2, the semiconductor C is provided with the same ohmic connection and the drain connection D1 forms an ohmic connection to the semiconductor. Again, the gate G1 with its junction in the conductive channel C is likewise provided with an ohmic connection and the intrinsic static blocking region I is mounted in the same relative position with the gate as that illustrated in FIG. 1. This semiconductor has two drains. Another drain D2 and another static intrinsic blocking region I2 with its respective gate G2.

The drain connections in this semiconductor are illustrated on opposite sides of the source and each drain connection has its own gate and each respective gate forms its respective field as indicated in dotted lines to intersect the edge of the static intrinsic blocking region.

Here the region may be operated to shut off the flow of current in either direction from the ohmic connection S1 to D1 and D2 respectively or otherwise control the amount of chocking by varying the dynamic intrinsic blocking region which in essence modulates the conductive channel. In other words, by use of the static intrinsic blocking region in the transistor, one is enabled to employ a gate junction to project a field that is effective in arresting the carriers covered by this field between the end of the field and the static intrinsic blocking region I. If, however, the dynamic intrinsic blocking region of the field engages or penetrates the static intrinsic blocking region, the whole of the field effect will arrest any movement of the characters preventing any current flow.

If one of the drain connections D1 or D2 is biased relative to S1, this bias voltage will likewise build up a dynamic intrinsic field between the biased ohmic connection and the dynamic intrinsic field by the gate as indicated by gate 2 by the dotted area which also extends to the static intrinsic blocking region.

Referring now to FIG. 3, where the unipolar conductive material C has provided at one end thereof a source contact S3 and at the opposite end thereof a series of independent static intrinsic blocking regions indicated at I3, I4, I5 and I6 separating four portions of the conductive channel region C into portions C1, C2, C3 and C4. A gate G3 is likewise placed in the unipolar regions C with at least one edge of the gate junction extending substantially at the ends of the respective static intrinsic blocking regions I3, I4, I5 and I6 so that the field F3 by the gate G3 will be effective in blocking off each of the conductive channels C1 to C4 progressively. It is best to provide a static intrinsic blocking region as illustrated at I6 in the opposite end of the conductive regions C so as to insure that the field F is effective to intersect this blocking region and insure complete cut-off of current flow through channel C4. When the field is removed and if removed in a retrogressive act, then each of the channels C1, C2, C3 and C4 will progressively become conductive in the reverse order.

On the other hand, any one of or all of these conductive channels which are indicated as conductive channel portions may be biased relative to the ohmic connection S3 from their respective ohmic connections D1 to D4 so as to induce in their respective channels an additional dynamic intrinsic blocking region when the dynamic intrinsic blocking region F occurs.

Referring now to FIG. 4 which in many respects is quite similar to FIG. 3 with the exception that the static intrinsic blocking regions I3, I4, I5 and I6 extend below the positions of junctions of the opposed gates G4*a* and G4*b* so that their respective dynamic intrinsic fields will penetrate the intermediate static intrinsic blocking regions to insure control of the flow of current through the respective conductive channel portions C1, C2, C3 and C4. Here the fields F4*a* and F4*b* may cooperate with each other in producing a dynamic blocking area with a certain orifice to allow a certain number of carriers to move with the electrons moving one way and the holes moving in the opposite direction so as to control the current passage through this dynamic orifice. However, if they terminate or both intersect the same static intrinsic blocking region, the carriers will be arrested and current flow will be stopped.

Referring now to FIG. 5, which is in some ways similar to FIGS. 2 and 4 in that gates are employed at the opposite ends of the semiconductor for the control of the separate conductive channels noted at $N_1$, $N_2$, $N_3$ and $N_4$ at one end and $P_1$, $P_2$, $P_3$ and $P_4$ at the opposite end. This is a bipolar semiconductor with the source of power indicated at S5 representing an ohmic connection and wherein the drain connections DN1 to DN4 provide circuit connections for the bipolar end of the semiconductor and the connections DP1 to DP4 represent the drain connections at the opposite end of the semiconductor wherein the conductive channels are of the same material P as that of the source region indicated by this source ohmic connection S5.

In FIG. 5 the gates GN1 and GN2 provide their junctions with the P material so that the field formed by these gate junctions will intersect at least the end of static intrinsic blocking regions that separate the conductive channel portions at opposite ends of the semiconductor.

The gates GP1 and GP2 as well as the gates GN1 and GN2 are, of course, doped with N material because the junction is within the P material. If, however, the exterior of this semiconductor was provided with a static intrinsic blocking region, then the gates could be either P or N material.

Referring now to FIG. 6, the semiconductor is likewise a bipolar semiconductor which has P material at one end and the N material at the opposite end. The ohmic connections to each of the sections of SN1 to SN4 represent the ohmic source connections to this semiconductor there being four in all and the same being controlled by the gates GN1 and GN2. The opposite end of the semiconductor having the P material, is provided with the ohmic drain connections DP1 and DP4 and their respective gates GN3 and GN4 are opposed in the same manner as the gates GN1 and GN2. Here again since all four gates are in the same material which is N, these gates would be doped with P material.

In this semiconductor it will be noted that the gates GN1 and GN2 will control the movement of the carriers in the N material which carriers are from one or more sources. In other words, it is obvious from this invention that one may control one or more of a plurality of sources as well as control one or more of a plurality of drains to promote intricate switching operations.

It is an important object of this invention to employ a static intrinsic blocking region in various ways within the semiconductor to permit the use of the dynamic intrinsic blocking regions through the rest of the carriers by the field effect of the gates.

It is obvious from the foregoing disclosure that the source and drain may be controlled whether the semiconductor is a bipolar, or unipolar. The principal fact that permits this control is the use of the dynamic as well as the static intrinsic blocking regions, the one being formed by the effect of the field by the gates and the other being formed by the fact that the semiconductor material is not doped so that it does not have free clearance and functions as a blocking region.

Referring now to FIG. 7, it will be noted that the semiconductor structure illustrated provides an N material in the body and as the source ohmic connections are made to the separate sources 7S1 to 7S5 all of which are each isolated by the static intrinsic blocking region. Here the gates rather than being positioned adjacent the ends of the blocking region are stacked on opposite faces of the semiconductor and are indicated by the reference numerals 7GN1, 7GN3, 7GN5, 7GN7 and 7GN9 on one face and 7GN2, 7GN4, 7GN6, 7GN8 and 7GN10 on the opposite face. On the opposite end of the semiconductor the drain connections 7D1 through 7D5 are likewise isolated by the static intrinsic blocking region I and the ohmic gate connections to the respective gates 7GP1, 7GP3, 7GP5, 7GP7, and 7GP9 on one face and 7GP2, 7GP4, 7GP6, 7GP8 and 7GP10 on the opposite face.

The singular thing in regard to this structure is that it shows the static intrinsic blocking region on the outer faces of the semiconductor and each of the gates have their respective junctions with the static intrinsic blocking region. However, the fields impressed thereon are effective across these static intrinsic blocking regions I and are effective to arrest the movement of carriers in the conductive channel regions influenced by these dynamic intrinsic blocking region field effects. In other words, the field of a gate may pass through the static intrinsic blocking regions I and be effective across a remote conductive channel region so long as the field effect is capable of being projected in this manner. These dynamic intrinsic blocking regions may be so controlled to operate in conjunction with any pair of gates on opposite faces to produce a desired control. In other words the gates of either 7GP series would not only cooperate with their opposed 7GP series but may also operate with the 7GN series. It is preferable to employ an opposed gate or gates on the opposite sides of the semiconductor. However two odd gates of the 7GP and 7GN series may be provided with a field cooperating with each other that can be effected by a field induced on one of the even series of 7GP or 7PN. These field effects may be shaped or may be caused to be combined to produce a specific result within the semiconductor in regard to selected channels.

Obviously when circuits are connected between the ohmic connections of a complex semiconductor of this character, the circuit itself may induce a current flow between a specific source and drain connections. It may also function in the nature of a bias voltage insofar as other source or drain connections are concerned and in this manner induce a dynamic field effect or dynamic intrinsic area wherein the blocking may be controlled to allow a certain degree of current flowing to another channel or between ohmic connections involving other channels to function in the manner of a compound switching control wherein one master circuit when set and controlled by gates will be effective in controlling the subordinate circuits. These subordinate circuits are likewise controlled by other gates but the current flow itself is conductive through bias voltage fields which have the control of quantity of flow through the subordinate circuits. Installations of this character have the feature that the bias voltage on the P material in the conductive channel, wherein the gate is across the N material of the same channel, functions as a dynamic intrinsic blocking region to build up a dynamic intrinsic blocking region between the field and the ohmic connection of the P material. Thus, various combinations may be set up and controlled in this switching device depending upon the character of field placed in the semiconductor and its effect by the passage of a current in the same semiconductor which in itself extends the property of the use of a switching device comprising this invention.

FIG. 8 is the diagrammatic series of a hexahedron semiconducting material provided with a plurality of channels having a common N type semiconductor in the center with a source 8S and at each end thereof quadrangularly arranged opposed gates 8GY1, 8GY2, and 8GX1 and 8GX2 as the left series and the same character of gates as the right series being numbered 8GY3 and 8GY4 and 8GX3 and 8GX4. The axially disposed gates are numbered 8GZX1 with an opposed gate 8GZX2 and opposed gates 8GZY1 and GZY2.

These gates will divide the N material at the source connections from 8S1 to 8S4 so that they may be divided axially in at least four quadrants as shown in this figure, thus, dividing the channels as well as the N material into quadrants. Each end of this hexahedron semiconductor has showing four conductive channel regions with P material in each quadrant and each conductive channel is bound by static intrinsic material I so as to produce 16 separate channels which may, of course, be any multiple thereof. However, it is simpler to demonstrate the principles of this invention with a hexahedron semiconductor of this character.

Each of the ends of the conductive channel regions may be provided with a drain connection D which, of course, may be substituted with a phosphorous compound that is conductive and the whole of the region having an outer transparent conductor coating such as a semiconductor structure would form a video tube in the structure of this character. Otherwise the D connections may be employed as switching units used in combination with the similar conductive channels at the opposite ends of the hexahedron which are likewise provided with P material encircled or isolated by the static intrinsic region material that extends at least to the aforementioned gates. Here, again, the drain connections D may be employed to function as independent ohmic switching connections or if provided with a conductive phosphorous compound in connection with a transparent conductor coating may be employed as a video receiving device.

FIGS. 9 and 10 illustrate, respectively, a video receiver device and a video camera device. In FIG. 9, the video output device is received in the N material and is scanned by the gates indicated at 9GX1 and 9GX2 and the opposed gates 9GY1 and 9GY2, the fields of which at least engage the intrinsic channels formed in an XY plane and fanning out to form a larger surface with a static intrinsic region separating each of the panel regions indicated at P. As illustrated in FIG. 9, the outer end of the P material is coated with a phosphorous material which is coated with a transparent conductor coating.

In FIG. 10, the camera device is the same as that shown in FIG. 9, only the circuit is connected in a different manner to produce a camera rather than provide the reproduction device.

Both of FIGS. 9 and 10 demonstrate that which is initially disclosed in FIG. 8 but illustrates how the conductive channels may be made to increase in size in order to produce a solid state enlargement of the picture.

FIG. 11 is a diagrammatic view illustrating a semiconductor which provides a video reproduction of an image in three dimensions one on the XY axis, another on XZ dimension and another on YZ dimension. As depicted, a series of conductive channels for each panel is provided with gate connections G to perform their independent functions to produce each face of a three dimensional figure whether it be a moving wave or a video reproduction. As a three dimensional scope, this device will accurately depict the wave in its true form of propagation.

FIG. 12 is a diagrammatic showing of the combination of hexahedron units such as illustrated in FIG. 8, each having a central portion that connects to each hexahedron projection in each direction depending upon the shape of the base, which, in this instance, is a cube or a hexahedron. When each of the six units are added to this base forming a three dimensional cross, one or more of the units may be employed as an interconnection for conductive channels to a similar unit being one of six in said units as illustrated in FIG. 12.

Here the cluster of semiconductor hexadron units are preferably interconnected to provide a short distance between the forms making up the cluster so as to maintain the lowest possible resistance to flow of the carriers in performing switching connections between any one of a combination of the individual conductive channels of any one of the hexahedron points of the star or three dimensional cross.

The whole purpose of FIG. 12 is to demonstrate that structures such as illustrated in FIG. 8, when expanded into clusters as illustrated in FIG. 12, may produce a switching device or any other character of computer circuit in a materially smaller space and with materially smaller weight but of materially greater accuracy and dependability.

I claim:

1. A field effect semiconductor switching device comprising a conductive semiconductive channel region having branch channel portions, said branch channel portions being separated from each other by intrinsic semiconductor insulating regions, each of said branch channel portions having drain connection means, at least one source connection means connected to other portions of said conductive semiconductor channel region, circuit means to bias said drain and source connection means to provide a conduction path between each source and drain connection means, gate electrode means connected to at least one of said branch channel portions and said intrinsic semiconductor insulating regions, and circuit means connected to said gate electrode means to induce a space charge cooperative with said intrinsic regions and across selective ones of said branch channel portions to block the respective conductive paths between said source connection means and said drain connection means and to thereby selectively control and switch the conduction paths available to the charge carriers flowing between said source and drain connection means.

2. The field effect semiconductor switching device of claim 1 characterized in that said gate electrode means includes a pair of gate electrodes positioned on opposite sides of said device, said space charge induced from said gates consisting of an opposed pair of space charges cooperatively operated by said circuit means to selectively control and switch said conduction paths.

3. The field effect semiconductor switching device of claim 1 characterized in that selected of said drain connection means include conductive semiconductive channel region portions of opposite type conductivity as said branch channel portions to respectively form a rectifying barrier at the interface of each selected of said branch channel region portions and said channel region portions of opposite type conductivity.

4. The field effect semiconductor switching device of claim 1 characterized by said conductive semiconductive channel region having a second plurality of branch channel portions separated from each other by intrinsic semiconductor insulating regions, said source connection means connected respectively to said second plurality of branch channel portions, second gate electrode means connected to at least one of said second branch channel portions and said second intrinsic semiconductor insulating regions, and second circuit means connected to said second gate electrode means to include a second space charge cooperative with said second intrinsic regions and across selective ones of said second branch channel portions to block the respective conductive paths in said second channel portions between said source connection means and said drain connection means and to thereby selectively control and switch the conduction paths available to the charge carriers flowing between said source and drain connection means.

References Cited

UNITED STATES PATENTS

| | | | |
|---|---|---|---|
| 3,339,272 | 9/1967 | MacIver et al. | 29—571 |
| 3,344,324 | 9/1967 | Beale | 317—235 |
| 3,227,896 | 1/1966 | Teszner | 307—885 |

JOHN W. HUCKERT, Primary Examiner

B. ESTRIN, Assistant Examiner

U.S. Cl. X.R.

250—211; 313—65; 317—234